(12) United States Patent
Miyo et al.

(10) Patent No.: US 7,193,922 B2
(45) Date of Patent: Mar. 20, 2007

(54) SEMICONDUCTOR INTEGRATED CIRCUIT

(75) Inventors: Toshiya Miyo, Kawasaki (JP); Toshikazu Nakamura, Kawasaki (JP); Satoshi Eto, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/968,072

(22) Filed: Oct. 20, 2004

(65) Prior Publication Data
US 2005/0052935 A1    Mar. 10, 2005

Related U.S. Application Data

(63) Continuation of application No. PCT/JP02/05421, filed on Jun. 3, 2002.

(51) Int. Cl.
G11C 8/00    (2006.01)
G11C 5/06    (2006.01)

(52) U.S. Cl. .......................... 365/230.03; 365/230.06; 365/63

(58) Field of Classification Search ........... 365/230.03, 365/230.06, 233, 145, 149, 154, 156, 227, 365/189.05, 175, 51, 200, 63
See application file for complete search history.

(56) References Cited

U.S. PATENT DOCUMENTS

| | | | | |
|---|---|---|---|---|
| 6,078,532 A | * | 6/2000 | Rivers et al. | 365/230.06 |
| 6,101,146 A | * | 8/2000 | Maesako et al. | 365/230.03 |
| 6,104,045 A | * | 8/2000 | Forbes et al. | 365/175 |
| 6,169,684 B1 | * | 1/2001 | Takahashi et al. | 365/149 |
| 6,356,484 B2 | * | 3/2002 | Dosaka et al. | 365/189.05 |
| 6,434,661 B1 | * | 8/2002 | Konishi et al. | 365/233 |
| 6,507,510 B2 | * | 1/2003 | Takashima | 365/230.03 |
| 6,584,013 B2 | * | 6/2003 | Senda et al. | 365/227 |
| 6,735,141 B2 | * | 5/2004 | Ikeda et al. | 365/149 |

FOREIGN PATENT DOCUMENTS

| | | |
|---|---|---|
| JP | 08-185695 | 7/1996 |
| JP | 11-086564 | 3/1999 |
| JP | 2000-223589 | 8/2000 |
| JP | 2000-243078 | 9/2000 |

* cited by examiner

*Primary Examiner*—Trong Phan
(74) *Attorney, Agent, or Firm*—Arent Fox PLLC

(57) ABSTRACT

Second memory cells of a second memory block each have an area $2^a$ times (a is a positive integer) that of each first memory cell of a first memory block. Sizing the first and second memory cells in a predetermined ratio can make easily identical the dimensions of the first memory block and the second memory block. Consequently, it is possible to easily align peripheral circuits to lie around the plurality of first and second memory blocks, such as decoders. This also facilitates the wiring of signal lines to be connected to the peripheral circuits. This makes it possible to improve the layout design efficiency for a semiconductor integrated circuit. Thus, a plurality of types of memory blocks can be formed on a semiconductor integrated circuit efficiently. The semiconductor integrated circuit can be prevented from increasing in chip size depending on the layout design, owing to its simplified layout.

6 Claims, 8 Drawing Sheets

SEMICONDUCTOR INTEGRATED CIRCUIT

CROSS REFERENCE TO RELATED APPLICATION

This application is a continuation application of International Application PCT/JP 02/05421, filed Jun. 3, 2002, and designating the U.S.

BACKGROUND OF THE INVENTION

1. Field of the Invention

The present invention relates to a layout technology for a semiconductor integrated circuit to implement a plurality of types of semiconductor memories on a single chip.

2. Description of the Related Art

Portable equipment such as a cellular phone implements a plurality of types of semiconductor memories such as a flash memory, a dynamic RAM (hereinafter, also referred to as DRAM), and a static RAM (hereinafter, also referred to as SRAM). In response to demands for further miniaturization of the portable equipment, multi-chip packages implementing a plurality of types of semiconductor memories in a single package have been developed recently. Technologies for forming a plurality of semiconductor memories on a single chip have also been developed.

For example, Japanese Unexamined Patent Application Publications Nos. Hei 8-185695, Hei 11-86564, 2000-243078, and 2000-223589 have disclosed the technologies for forming a plurality of semiconductor memories on a single chip.

Japanese Unexamined Patent Application Publication No. Hei 8-185695 discloses the technology of sharing word lines between a DRAM core and an SRAM core and operating the DRAM core and SRAM core simultaneously.

Japanese Unexamined Patent Application Publications Nos. Hei 11-86564 and 2002-243078 disclose the technology of transferring data between a DRAM array and an SRAM array bidirectionally.

Japanese Unexamined Patent Application Publication No. 2000-223589 discloses the technology of forming different types of DRAM arrays on a single chip by equalizing the pitches of the bit line and the word line.

In the conventional art, however, no particular contrivance has been made as to the layout of the memory cells for the sake of mounting different types of semiconductor memories in combination. For example, in Japanese Unexamined Patent Application Publications Nos. Hei 8-185695 and Hei 11-86564, existing DRAM memory cells and existing SRAM memory cells are used to form the semiconductor integrated circuits. There have thus been the problems of increased development periods and development costs since the layout design (floor planning) of the memory cell arrays and the peripheries thereof requires manual procedures. In particular, the development periods increase significantly in developing a plurality of semiconductor integrated circuits having different memory capacities.

In Japanese Unexamined Patent Application Publication No. 2000-223589, a semiconductor integrated circuit is composed of 2Tr1C type memory cells and 1Tr1C type memory cells. A 2Tr1C type memory cell is formed by connecting the storage nodes of two 1Tr1C type memory cells to each other via wiring. That is, the two types of memory cells have cell transistors and capacitors of the same basic structures, so that their bit lines or word lines come to have the same pitches with no particular contrivance to the layout.

SUMMARY OF THE INVENTION

It is an object of the present invention to form a plurality of types of semiconductor memories on a semiconductor integrated circuit with efficiency.

According to one of the aspects of the semiconductor integrated circuit of the present invention, a first memory block has first memory cells and a second memory block has second memory cells of a type different from that of the first memory cells. The first and second memory cells operate independent of each other. The second memory cells each have an area $2^a$ times (a is a positive integer) the area of each of the first memory cells. For example, the vertical size of each of the second memory cells is $2^b$ times (b is a positive integer) the vertical size of each of the first memory cells. The horizontal size of each of the second memory cells is $2^c$ times (c is a positive integer) the horizontal size of each of the first memory cells. For example, the first memory cells are memory cells of a dynamic RAM. The second memory cells are memory cells of a static RAM.

Since the first and second memory cells are sized in a predetermined ratio, the dimensions of the first memory block and the second memory block can be made identical to each other easily. Consequently, peripheral circuits to lie around the plurality of first and second memory blocks, such as decoders, can be aligned easily. This also facilitates the wiring of signal lines to be connected to the peripheral circuits. As a result, it is possible to improve efficiency in the layout design of the semiconductor integrated circuit. That is, a plurality of types of memory blocks can be formed on a semiconductor integrated circuit with efficiency. Owing to its simplified layout, the semiconductor integrated circuit can be prevented from increasing in chip size depending on the layout design.

According to another aspect of the semiconductor integrated circuit of the present invention, the first memory block has first bit lines and first word lines connected to the first memory cells. The second memory block has second bit lines and second word lines connected to the second memory cells. The first and second bit lines are wired in the same direction. The first and second word lines are wired in the same direction. Wiring the bit lines and word lines of memory blocks of different types in the same direction makes it possible to easily arrange the same types of peripheral circuits (such as decoders and amplifiers) on the same sides around both the memory blocks. This consequently facilitates the layout design.

According to another aspect of the semiconductor integrated circuit of the present invention, the length of the first memory block in the direction of the first bit lines and the length of the second memory block in the direction of the second bit lines are the same. For example, the first memory cells are memory cells of a dynamic RAM. The second memory cells are memory cells of a static RAM. The first memory block includes a sense amplifier row for amplifying data signals on the first bit lines. The second memory block includes a redundancy memory cell row and a connection area for connecting a well region formed in its semiconductor substrate with a power supply line.

According to this aspect, it is possible to arrange a plurality of first and second memory blocks, not protruding in the direction of the bit lines. Consequently, peripheral circuits can be aligned in a row at the ends of the bit lines of the first and second memory blocks. This facilitates the wiring of signal lines to be connected to the peripheral circuits such as column decoders and amplifiers.

According to another aspect of the semiconductor integrated circuit of the present invention, the length of the first memory block in the direction of the first word lines and the length of the second memory block in the direction of the second word lines are the same. It is therefore possible to arrange a plurality of first and second memory blocks, not protruding in the direction of the word lines. Consequently, peripheral circuits can be aligned in a row at the ends of the word lines of the first and second memory blocks. This facilitates the wiring of signal lines to be connected to the peripheral circuits such as word decoders.

According to another aspect of the semiconductor integrated circuit of the present invention, a first amplifier row is formed on one end of the first memory block, and inputs/outputs data signals from/to the first bit lines. A second amplifier row is formed on one end of the second memory block, and inputs/outputs data signals from/to the second bit lines. Since the first and second bit lines are wired in the same direction, the first and second amplifier rows can be arranged in a row in the same direction. This facilitates sharing of signal lines such as a data bus line to be connected to the first and second amplifier rows. That is, a common data bus line can be wired over the first and second amplifier rows in the direction in which these amplifier rows are arranged. As a result, it is possible to reduce the wiring area of the signal lines to minimum and reduce the chip size of the semiconductor integrated circuit.

According to another aspect of the semiconductor integrated circuit of the present invention, a first column decoder row is formed on one end of the first memory block, and selects any one of the first bit lines according to a column address signal. A second column decoder row is formed on one end of the second memory block, and selects any one of the second bit lines according to the column address signal. Since the first and second bit lines are wired in the same direction, the first and second column decoder rows can be arranged in a row in the same direction. This facilitates sharing of signal lines such as a column address signal line to be connected to the first and second column decoder rows. That is, a common column address signal line can be wired over the first and second column decoder rows in the direction in which these column decoder rows are arranged. As a result, it is possible to reduce the wiring area of the signal lines to minimum and reduce the chip size of the semiconductor integrated circuit.

According to another aspect of the semiconductor integrated circuit of the present invention, a first word decoder row is formed on one end of the first memory block, and selects any one of the first word lines according to a row address signal. A second word decoder row is formed on one end of the second memory block, and selects any one of the second word lines according to the row address signal. Since the first and second word lines are wired in the same direction, the first and second word decoder rows can be arranged in a row in the same direction. This facilitates sharing of signal lines such as a row address signal line to be connected to the first and second word decoder rows. That is, a common row address signal line can be wired over the first and second word decoder rows in the direction in which these word decoder rows are arranged. As a result, it is possible to reduce the wiring area of the signal lines to minimum and reduce the chip size of the semiconductor integrated circuit.

BRIEF DESCRIPTION OF THE DRAWINGS

The nature, principle, and utility of the invention will become more apparent from the following detailed description when read in conjunction with the accompanying drawings in which like parts are designated by identical reference numbers, in which.

DESCRIPTION OF THE PREFERRED EMBODIMENTS

Figure 1:
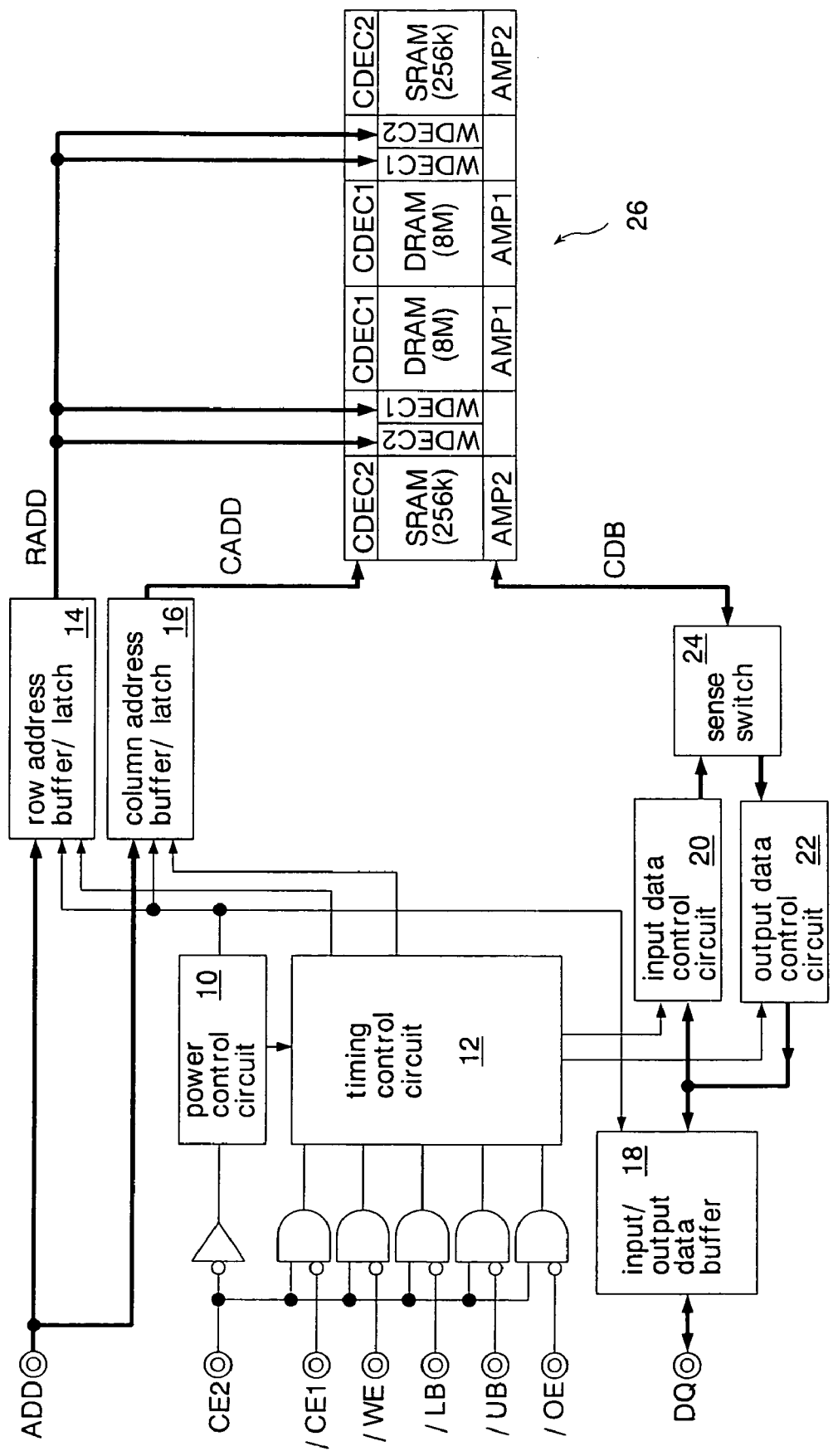
FIG. 1 is a block diagram showing a first embodiment of the semiconductor integrated circuit of the present invention.

Hereinafter, embodiments of the present invention will be described with reference to the drawings. In the drawings, each thick line represents a signal line that consists of a plurality of lines. The symbols "/" prefixed to signal names indicate negative logic. The double circles at the ends of signal lines represent external terminals. For the sake of simpler explanation, signal names may sometimes be abbreviated like "chip enable signal CE2" as "CE2 signal" and "write enable signal /WE" as "/WE signal".

FIG. 1 shows a first embodiment of the semiconductor integrated circuit of the present invention. This semiconductor integrated circuit is formed as a system memory, implementing two 8-Mbit DRAM blocks (first memory blocks) and two 256-kbit SRAM blocks (second memory blocks) on a single chip. In this embodiment, the DRAM blocks and the SRAM blocks are formed in the same size. The system memory is mounted on a cellular phone, for example. The DRAMs are used as working memories. The SRAMs are used as backup memories. For example, when the cellular phone is powered off normally, the working data stored in the DRAMs is written to a flash memory which is packaged with the system memory. Flash memories require longer write time than other memories. Thus, there will not be enough time to write the data in the DRAMs into the flash memory when the cellular phone runs short of the battery charge, or when the cellular phone falls to the ground and the battery comes off. In order to avoid data disappearance here, the data is temporarily backed up to the SRAMs.

The system memory comprises a power control circuit 10, a timing control circuit 12, a row address buffer/latch 14, a column address buffer/latch 16, an input/output data buffer 18, an input data control circuit 20, an output data control circuit 22, a sense switch 24, and a memory core 26 including the DRAM blocks and the SRAM blocks. The external terminals of the system memory are used commonly by the DRAM blocks and the SRAM blocks. The DRAM blocks and the SRAM blocks are distinguished by an upper address.

The power control circuit 10 outputs control signals for inactivating the timing control circuit 12, the row address buffer/latch 14, the column address buffer/latch 16, and the input/output data buffer 18 when a chip enable signal CE2 of low level is supplied to the external terminal. That is, when the system memory receives the chip enable signal CE2 of low level, it enters a low power consumption mode.

The timing control circuit 12 outputs timing signals for operating the row address buffer/latch 14, the column address buffer/latch 16, the input data control circuit 20, and the output data control circuit 22 according to a chip enable signal /CE1, a write enable signal /WE, a lower byte signal /LB, an upper byte signal /UB, and an output enable signal /OE which are supplied through the external terminals and logic gates. In performing a write operation, a controller accessing the system memory changes the CE2 signal and the /OE signal to a high level and the /CE1 signal and the /WE signal to a low level.

The row address buffer/latch 14 receives an address signal ADD through the external terminal, and outputs the received address to row address signal lines RADD. The column address buffer/latch 16 receives the address signal ADD through the external terminal, and outputs the received address to a column address signal line CADD.

The input/output data buffer 18 outputs an 8-bit data signal DQ (write data) received through the external terminal to the input data control circuit 20 in a write operation. The input/output data buffer 18 outputs a data signal DQ (read data) output from the output data control circuit 22 to the external terminal in a read operation.

The input data control circuit 20 outputs the write data to a common data bus line CDB through the sense switch 24. The output data control circuit 22 receives read data transmitted from the common data bus line CDB through the sense switch 24.

The memory core 26 has first column decoder rows CDEC1, first word decoder rows WDEC1, and first amplifier rows AMP1 corresponding to the DRAM blocks. The memory core 26 has second column decoder rows CDEC2, second word decoder rows WDEC2, and second amplifier rows AMP2 corresponding to the SRAM blocks. The first column decoder rows CDEC1, the first word decoder rows WDEC1, and the first amplifier rows AMP1 are arranged on three sides around the respective DRAM blocks. The second column decoder rows CDEC2, the second word decoder rows WDEC2, and the second amplifier rows AMP2 are arranged on three sides around the respective SRAM blocks.

The first and second column decoder rows CDEC1 and CDEC2 have a plurality of column decoders (not shown) which are formed in the horizontal direction of the diagram. The first and second word decoder rows WDEC1 and WDEC2 have a plurality of word decoders (not shown) which are formed in the vertical direction of the diagram. The first amplifier rows AMP1 have a plurality of sense buffers (not shown) which are formed in the horizontal direction of the diagram. The second amplifier rows AMP2 have a plurality of sense amplifiers (not shown) which are formed in the horizontal direction of the diagram. In the case of the DRAM blocks, read data from the memory cells is amplified by sense amplifiers inside the DRAM blocks, and then amplified further by the sense buffers in the first amplifier rows AMP1. In the case of the SRAM blocks, read data from the memory cells is amplified by the sense amplifiers in the second amplifier rows AMP2.

The DRAM blocks and the SRAM blocks are arranged in a row in the horizontal direction of the diagram. The first and second column decoder rows CDEC1 and CDEC2 are formed in the same size, and arranged in a row in the horizontal direction of the diagram. The first and second word decoder rows WDEC1 and WDEC2 are formed in the same size, and arranged in the vertical direction of the diagram. The first and second amplifier rows AMP1 and AMP2 are formed in the same size, and arranged in a row in the horizontal direction of the diagram at positions opposite to the first and second column decoder rows CDEC1 and CDEC2.

Figure 2:
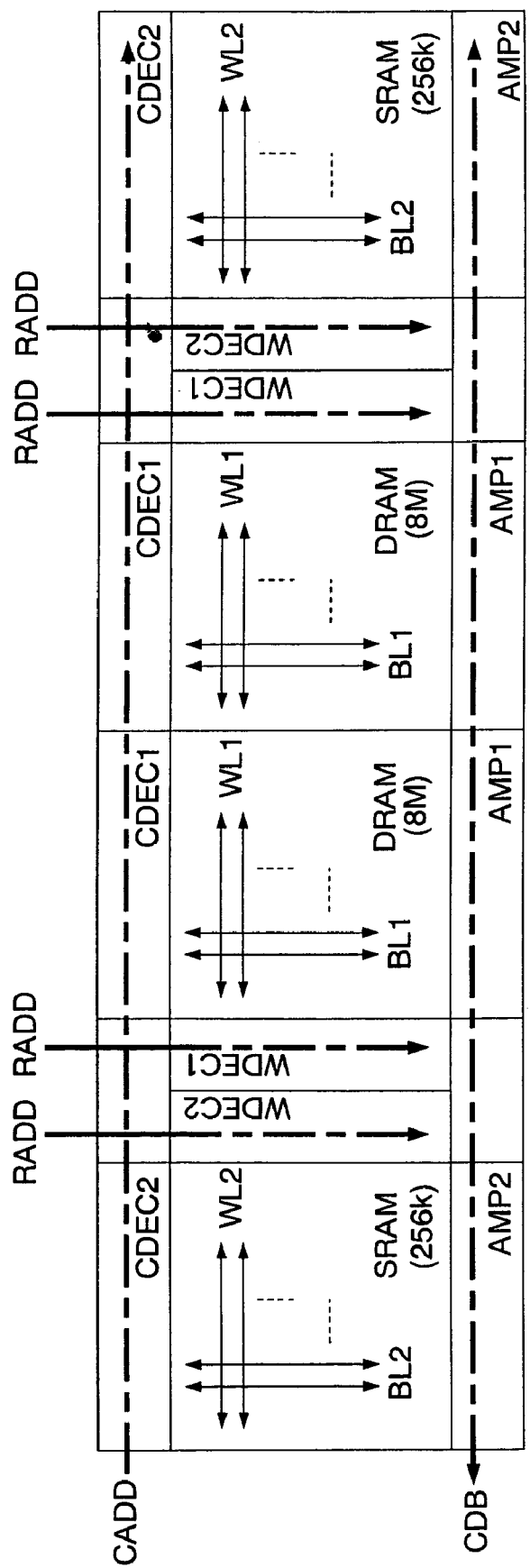
FIG. 2 is a layout diagram showing the details of the memory core shown in FIG. 1.

FIG. 2 shows the details of the memory array 26 shown in FIG. 1. In the diagram, the thick full lines represent lines of a first metal wiring layer. The thick broken lines represent lines of a second metal wiring layer.

The column address signal line CADD for transmitting the column address signal is laid over the first and second column decoder rows CDEC1 and CDEC2 in the horizontal direction of the diagram. That is, the column address signal line CADD is laid in the direction of arrangement of the first and second column decoder rows CDEC1 and CDEC2. The column address signal line CADD is in connection with the first and second column decoder rows CDEC1 and CDEC2, and used as a column address signal line CADD common to the first and second column decoder rows CDEC1 and CDEC2. The first and second column decoder rows CDEC1 and CDEC2 receive the column address signal transmitted through the common column address signal line CADD, and select predetermined bit lines BL1 (or BL2) according to the column address signal.

The common data bus line CDB for transmitting the data signal DQ is laid over the first and second amplifier rows AMP1 and AMP2 in the horizontal direction of the diagram. That is, the common data bus line CDB is laid in the direction of arrangement of the first and second amplifier rows AMP1 and AMP2. The common data bus line CDB is in connection with the first and second amplifier rows AMP1 and AMP2. The common data bus line CDB is then connected to the selected bit lines BL1 (or BL2) by column switches, and thus transmits the data signal DQ.

The row address signal lines RADD for transmitting the row address signal are laid over the respective first and second word decoder rows WDEC1 and WDEC2 in the vertical direction of the diagram. The row address signal lines RADD are in connection with the word decoder rows WDEC1 and WDEC2, respectively. The first and second word decoder rows WDEC1 and WDEC2 receive the row address signal RADD transmitted through the row address signal lines RADD, and select predetermined word lines WL1 (or WL2) according to the row address signal.

Each of the DRAM blocks has a plurality of first word lines WL1 laid in the horizontal direction of the diagram, and a plurality of first bit lines BL1 laid in the vertical direction of the diagram. Each of the SRAM blocks has a plurality of second word lines WL2 laid in the horizontal direction of the diagram, and a plurality of second bit lines BL2 laid in the vertical direction of the diagram.

In this embodiment, as mentioned above, the DRAM blocks and the SRAM blocks have the same size. That is, the lengths of the DRAM blocks in the direction of the first bit lines BL1 and the lengths of the SRAM blocks in the direction of the second bit lines BL2 are the same. Similarly, the lengths of the DRAM blocks in the direction of the first word lines WL1 and the lengths of the SRAM blocks in the direction of the second word lines WL2 are the same.

Figure 3:
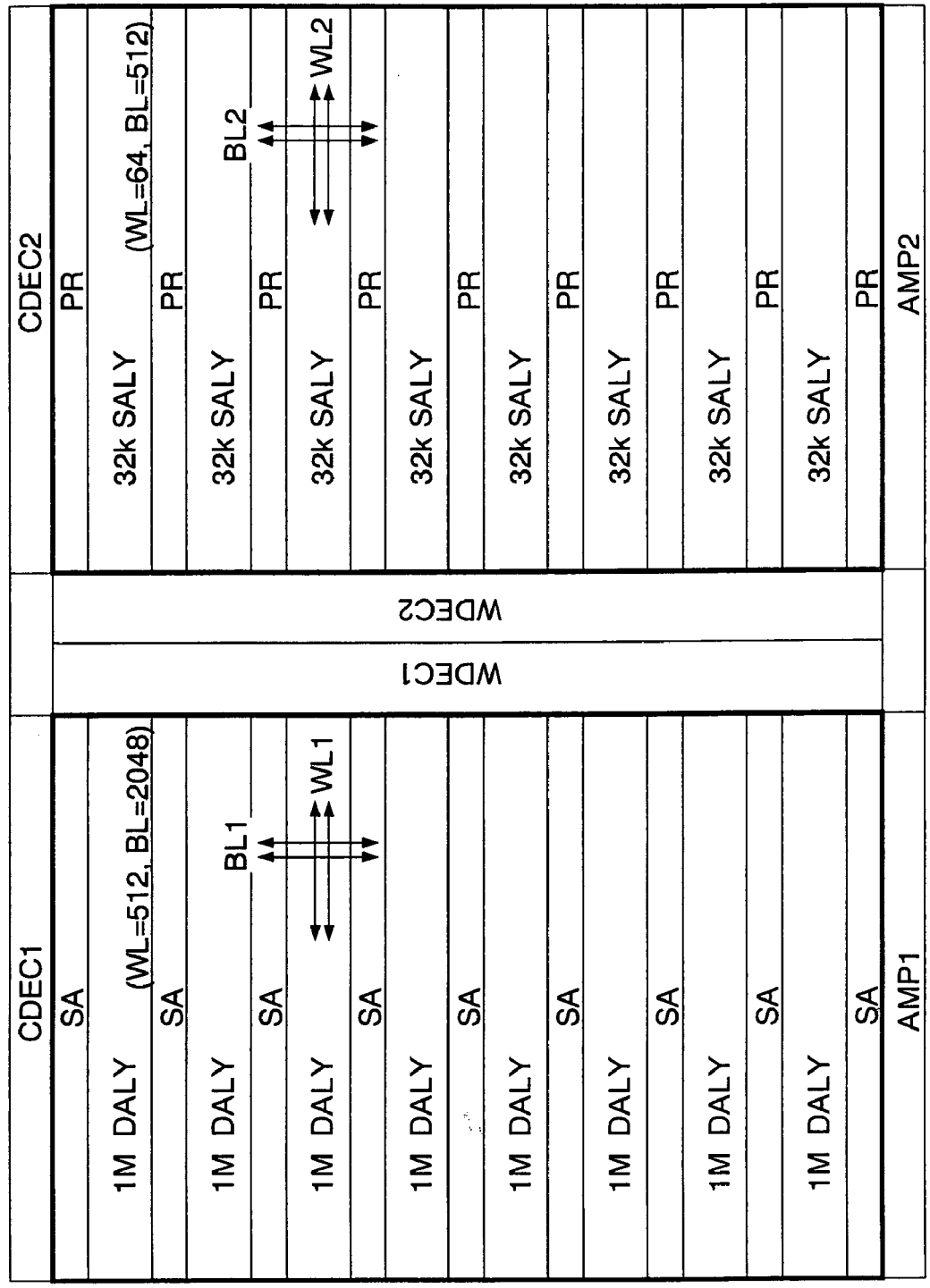
FIG. 3 is a layout diagram showing the details of the DRAM blocks and SRAM blocks shown in FIG. 1.

FIG. 3 shows the details of the DRAM blocks and the SRAM blocks.

A DRAM block has eight cell arrays DALY and nine sense amplifier rows SA which are arranged on both sides of these respective cell arrays DALY. Each of the cell arrays DALY is wired with 512 first word lines WL1 and 2048 first bit lines BL1. Each cell array DALY has a memory capacity of 1 Mbits. Each of the sense amplifier rows SA has a plurality of sense amplifiers (not shown) which are connected to the first bit lines BL1, respectively. A sense amplifier row lying between two cell arrays DALY is shared by the cell arrays DALY. The first bit lines BL1 are laid with respect to each of the cell arrays DALY. The first bit lines BL1 of the cell arrays DALY and the first amplifier row AMP1 are connected via global bit lines (not shown) which are laid in the vertical direction of the diagram.

Figure 8:
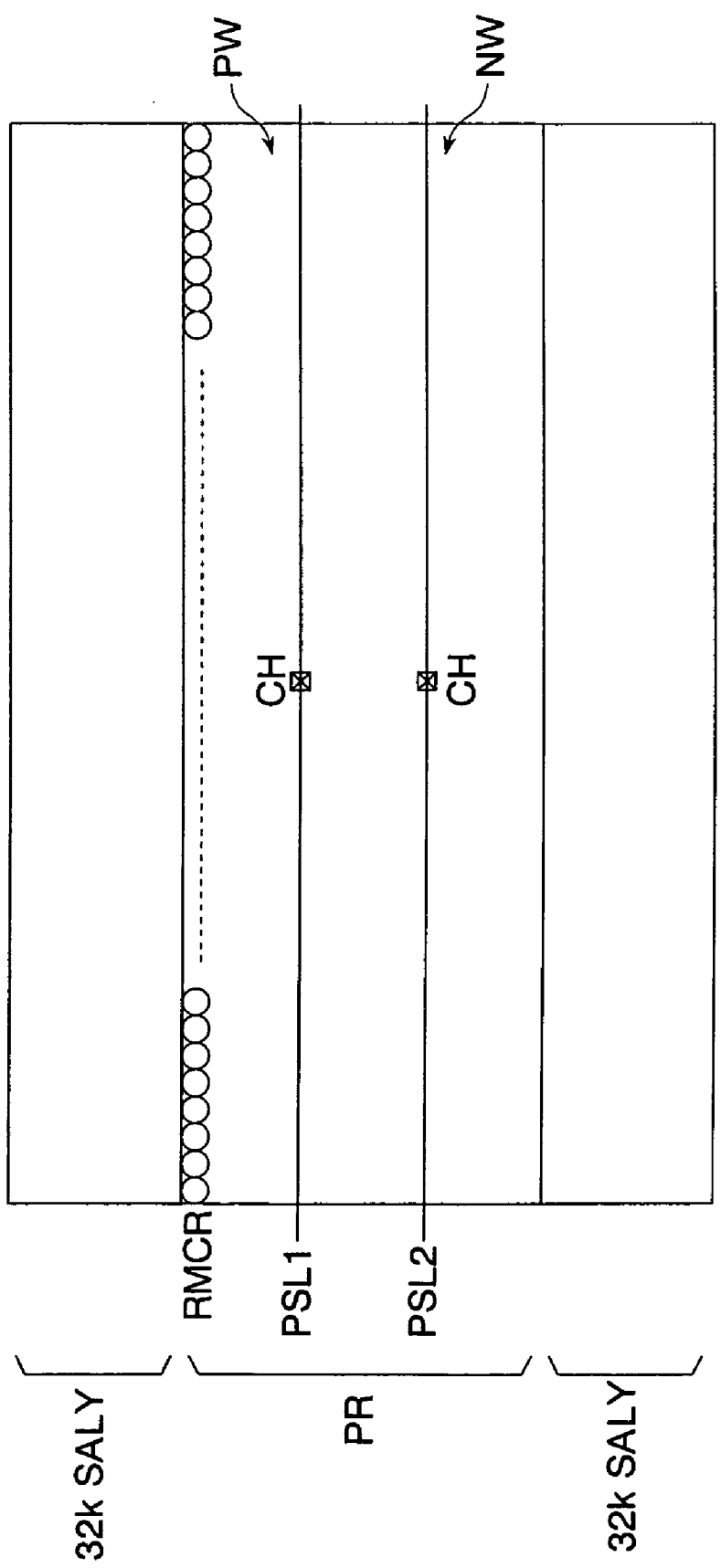
FIG. 8 is a block diagram showing the details of the SRAM blocks shown in FIG. 3.

An SRAM block has eight cell arrays SALY and nine peripheral regions PR which are formed on both sides of these respective cell arrays SALY. Each of the cell arrays SALY is wired with 64 second word lines WL2 and 512 second bit lines BL2. As shown in FIG. 8. each cell array SALY has a memory capacity of 32 kbits. Each of the peripheral regions PR is provided with a redundancy memory cell row RMCR for relieving a defective cell array SALY and contact holes CH (connection areas) for connecting p-type and n-type well regions PW, NW of the semiconductor substrate with respective power supply lines PSL1, PSL2.

The cell arrays DALY and SALY are given an identical length in the direction of the bit lines. The sense amplifier rows SA and the peripheral regions PR are also given an identical length in the direction of the bit lines. Thus, the DRAM blocks and the SRAM blocks have the same length in the direction of the bit lines. Consequently, as shown in FIG. 2, it is possible to arrange the first and second column decoder rows CDEC1 and CDEC2 in a row, and arrange the first and second amplifier rows AMP1 and AMP2 in a row. As a result, the column address signal line CADD and the common data bus line CDB can be laid straight in one direction. This facilitates floor planning (layout design) and allows a reduction in layout size. That is, the system memory can be reduced in chip size.

Figure 4:
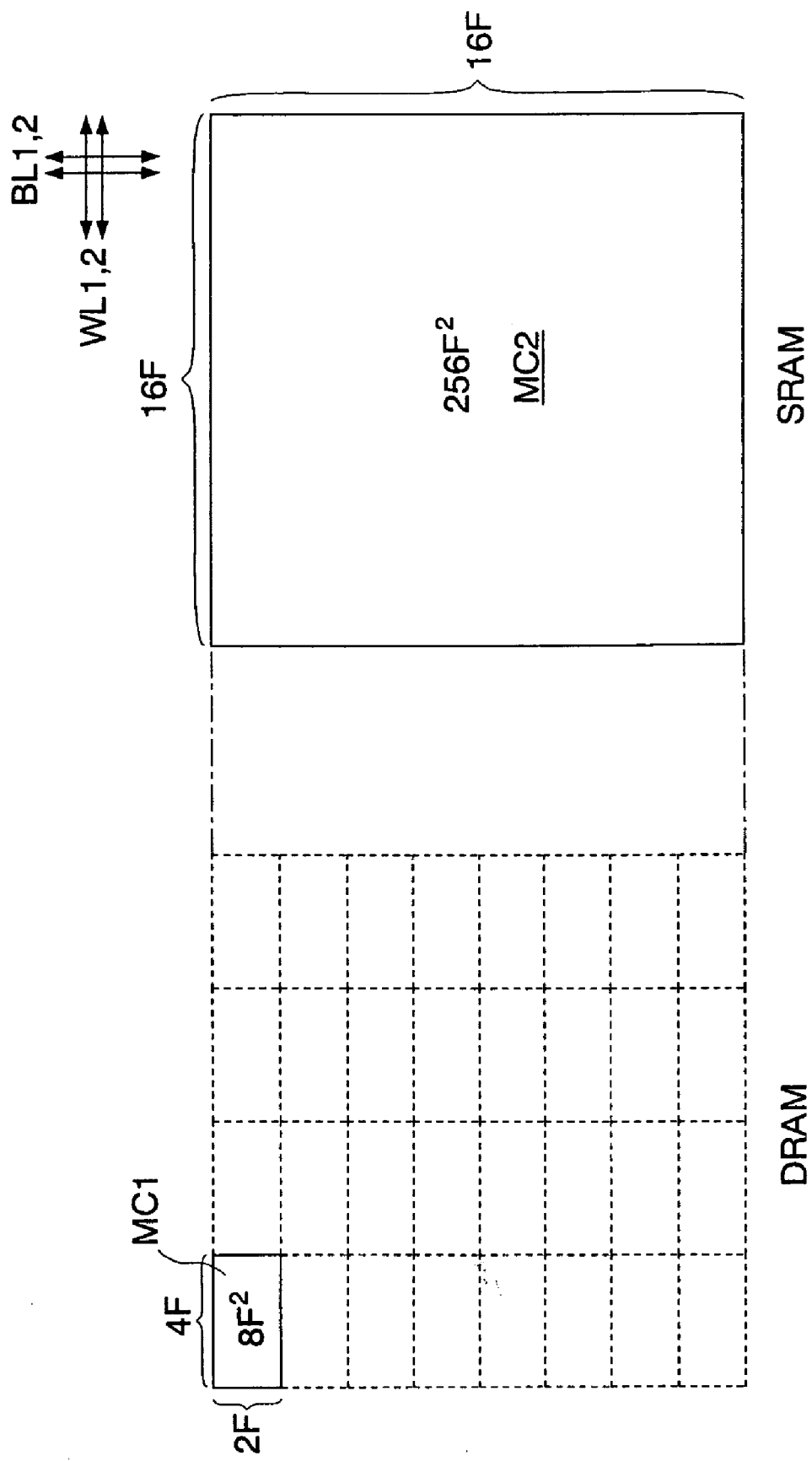
FIG. 4 is an explanatory diagram showing the dimensions of first memory cells in the DRAM blocks and second memory cells in the SRAM blocks.

FIG. 4 shows the dimensions of a first memory cell MC1 to be formed in the cell arrays DALY of the DRAM blocks and a second memory cell MC2 to be formed in the cell arrays SALY of the SRAM blocks. Here, the symbol "F" represents the minimum pitch of the wiring width.

The first memory cell MC1 is formed to 2 F in vertical size and 4 F in horizontal size. Thus, the first memory cell MC1 has an area of 2 F times 4 F or 8 $F^2$. The second memory cell MC2 is formed to 16 F both in vertical and horizontal sizes. That is, the vertical size and horizontal size of the second memory cell MC2 are four times and eight times the vertical size and horizontal size of the first memory cell MC1, respectively. The second memory cell MC2 has an area 32 times the area of the first memory cell MC1.

The dimensions of the cell arrays DALY and SALY can thus be made identical easily by designing the vertical size, horizontal size, and area of the second memory cell MC2 as $2^n$ times the vertical size, horizontal size, and area of the first memory cell MC1, respectively. In this example, existing DRAM memory cells are used as the first memory cells MC1. The second memory cells MC2 are designed in accordance with the first memory cells MC1.

As has been described, according to the present embodiment, the first and second memory cells MC1 and MC2 are given areas, vertical sizes, and horizontal sizes of predetermined ratios. This facilitates making the dimensions of the DRAM blocks and the SRAM blocks identical. Consequently, the DRAM blocks and the SRAM blocks can be aligned at both sides in a row. The column decoder rows CDEC1, CDEC2 and the amplifier rows AMP1, AMP2 to lie around the DRAM blocks and the SRAM blocks can thus be aligned easily.

In the DRAM blocks and the SRAM blocks, the wiring directions of the first and second bit lines BL1 and BL2 are made identical, and the wiring directions of the first and second word lines WL1 and WL2 are made identical. Consequently, the same types of peripheral circuits (such as CDEC1 and CDEC2) can be easily arranged on the same sides around the DRAM block and the SRAM blocks.

The lengths of the DRAM blocks in the direction of the first bit lines BL1 and the lengths of the SRAM blocks in the direction of the second bit lines BL2 are made identical. The plurality of DRAM blocks and SRAM blocks can thus be arranged without protruding in the direction of the bit lines BL1 and BL2. Consequently, the column decoder rows CDEC1 and CDEC2 can be aligned along the sides of the DRAM blocks and SRAM blocks at the ends of the bit lines BL1 and BL2. The amplifier rows AMP1 and AMP2 can otherwise be arranged in alignment. As a result, the common column address signal line CADD to be connected to the column decoder rows CDEC1 and CDEC2 can be laid easily.

In the DRAM blocks and SRAM blocks, the wiring directions of the first and second bit lines BL1 and BL2 are made identical. This makes it possible to arrange the first and second amplifier rows AMP1 and AMP2 in a row in the same direction. Consequently, the common data bus line CDB can be laid over the first and second amplifier rows AMP1 and AMP2 in the direction of arrangement of these amplifier rows AMP1 and AMP2. As a result, it is possible to minimize the wiring area of the common data bus line CDB.

Similarly, since the wiring directions of the first and second bit lines BL1 and BL2 are made identical, the first and second column decoder rows CDEC1 and CDEC2 can be arranged in a row in the same direction. Consequently, the common column address signal line CADD can be laid over the first and second column decoder rows CDEC1 and CDEC2 in the direction of arrangement of these column decoder rows CDEC1 and CDEC2. As a result, it is possible to minimize the wiring area of the common column address signal line CADD.

Consequently, it is possible to improve the layout design efficiency for the system memory and reduce the chip size of the system memory. That is, the DRAM blocks and the SRAM blocks can be implemented in the semiconductor integrated circuit with efficiency. The semiconductor integrated circuit can be prevented from increasing in chip size depending on the layout design.

Figure 5:
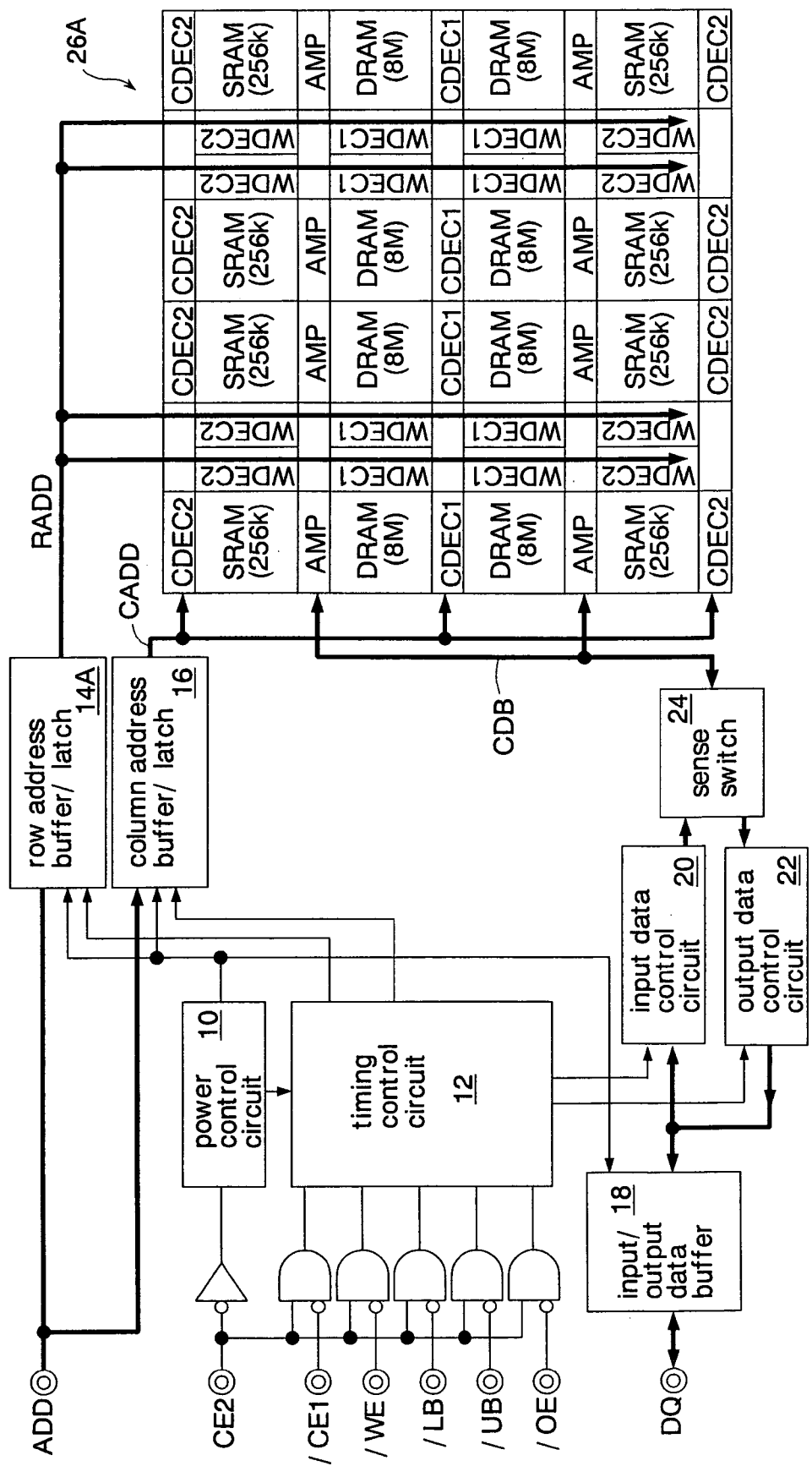
FIG. 5 is a block diagram showing a second embodiment of the semiconductor integrated circuit of the present invention.

FIG. 5 shows a second embodiment of the semiconductor integrated circuit of the present invention. The same elements as those of the first embodiment will be designated by identical reference numbers or symbols. Detailed description thereof will be omitted here.

In this embodiment, a row address buffer/latch 14A and a memory core 26A are formed instead of the row address buffer/latch 14 and the memory core 26 of the first embodiment. Moreover, the address terminal has two more lines than in the first embodiment. The rest of the configuration is the same as in the first embodiment. That is, this semiconductor integrated circuit is formed as a system memory, implementing eight 8-Mbit DRAM blocks (first memory blocks) and eight 256-kbit SRAM blocks (second memory blocks) on a single chip.

The row address buffer/latch 14A outputs a row address signal having two more bits than in the first embodiment to the row address signal line RADD.

The memory core 26A consists of four stages to which four SRAM blocks arranged in a row in the horizontal direction of the diagram and four DRAM blocks arranged in a row in the horizontal direction are stacked up. The DRAM blocks and the SRAM blocks have the same size. That is, as described in FIG. 2 of the first embodiment, the lengths of the DRAM blocks in the direction of the first word lines WL1 and the lengths of the SRAM blocks in the direction of the second word lines WL2 are the same.

The first column decoder rows CDEC1 are arranged between the DRAM blocks arranged in the vertical direction of the diagram, and are used commonly by these DRAM blocks. The second column decoder rows CDEC2 are arranged on one end of an SRAM block each. The first and second word decoder rows WDEC1 and WDEC2 are arranged beside the DRAM blocks and the SRAM blocks in the vertical direction of the diagram.

The amplifier rows AMP are arranged between adjoining SRAM and DRAM blocks. The amplifier rows AMP are used commonly by the DRAM and SRAM blocks. That is, the amplifier rows AMP function as the first and second amplifiers AMP1 and AMP2 of the first embodiment.

Since the DRAM blocks and the SRAM blocks have the same size, the first and second column decoder rows CDEC1, CDEC2 and the amplifier rows AMP can be arranged in respective rows in the horizontal direction of the diagram. Moreover, the first and second word decoder rows WDEC1 and WDEC2 can be arranged in rows in the vertical direction of the diagram. As a result, the common column address signal lines CADD, the common row address signal lines RADD, and the common data bus lines CDB can be laid straight over the memory core 16A.

This embodiment can provide the same effects as those of the first embodiment described above. Moreover, the DRAM blocks and the SRAM blocks are arranged with the first and second word lines WL1 and WL2 laid in the same direction. It is therefore possible to arrange the first and second word decoder rows WDEC1 and WDEC2 in a row in the same direction. Besides, the lengths of the DRAM blocks in the direction of the first word lines WL1 and the lengths of the SRAM blocks in the direction of the second word lines WL2 are made identical. The first and second word decoder rows WDEC1 and WDEC2 can thus be arranged in alignment around the DRAM blocks and the SRAM blocks. Consequently, the row address signal lines RADD can be laid over the first and second word decoder rows WDEC1 and WDEC2 in the direction of arrangement of these word decoder rows WDEC1 and WDEC2. As a result, it is possible to minimize the wiring area of the row address signal lines RADD.

Figure 6:
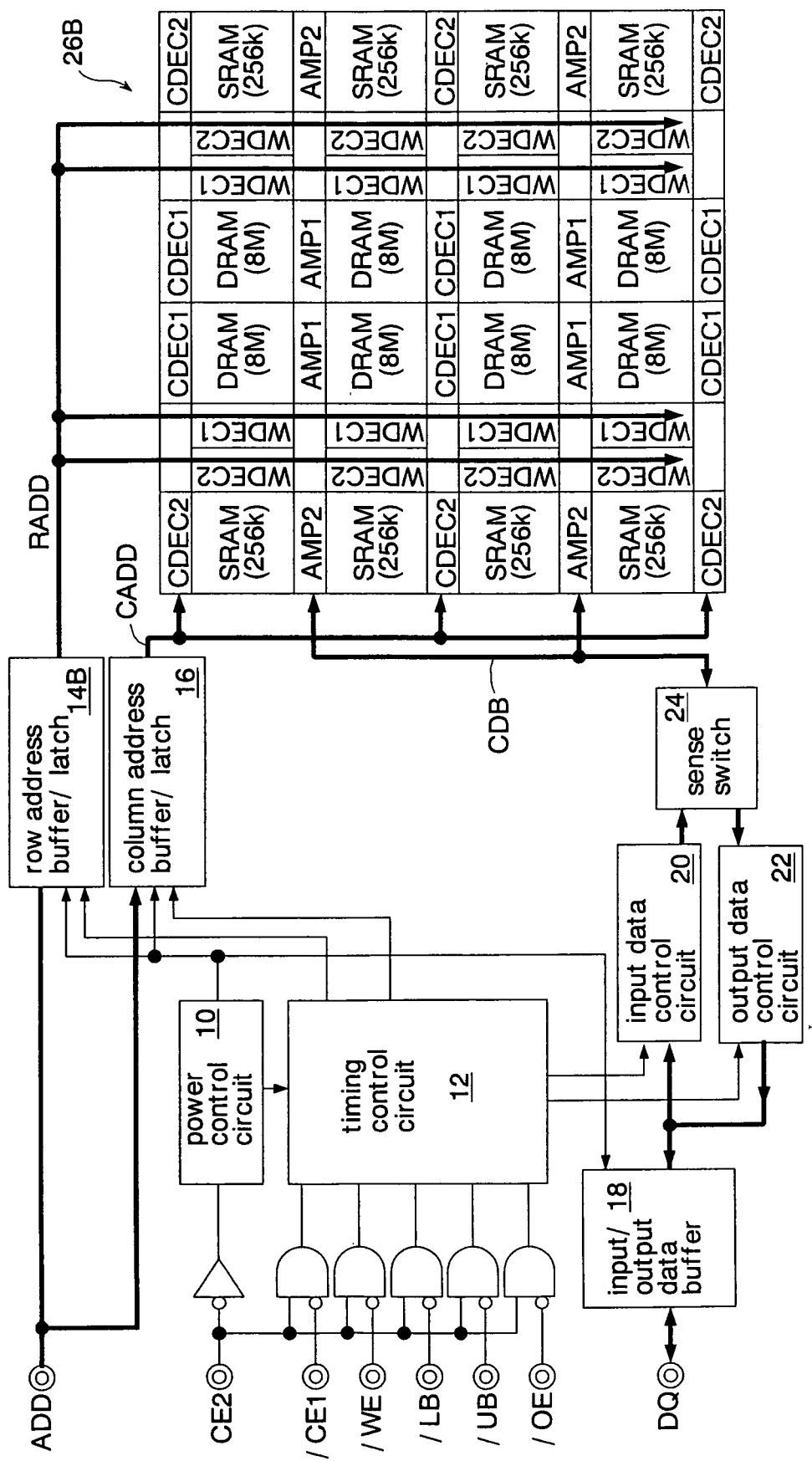
FIG. 6 is a block diagram showing a third embodiment of the semiconductor integrated circuit of the present invention.

FIG. 6 shows a third embodiment of the semiconductor integrated circuit of the present invention. The same elements as those of the first and second embodiments will be designated by identical reference numbers or symbols. Detailed description thereof will be omitted here.

In this embodiment, a row address buffer/latch 14B and a memory core 26B are formed instead of the row address buffer/latch 14 and the memory core 26 of the first embodiment. Moreover, the address terminal has two more lines than in the first embodiment. The rest of the configuration is the same as in the first embodiment. That is, this semiconductor integrated circuit is formed as a system memory, implementing eight 8-Mbit DRAM blocks (first memory blocks) and eight 256-kbit SRAM blocks (second memory blocks) on a single chip.

The memory core 26B consists of four stages into which four SRAM blocks arranged in a row in the vertical direction of the diagram and four DRAM blocks arranged in a row in the vertical direction are placed. The DRAM blocks and the SRAM blocks have the same size. The first and second column decoder rows CDEC1 and CDEC2 are arranged in the horizontal direction of the diagram. The first and second word decoder rows WDEC1 and WDEC2 are arranged individually in the vertical direction of the diagram. The first and second amplifier rows AMP1 and AMP2 are arranged in the horizontal direction of the diagram.

This embodiment can provide the same effects as those of the first and second embodiments described above.

Note that the foregoing embodiments have dealt with the cases where a second memory cell MC2 has an area 32 times ($2^5$ times) the area of a first memory cell MC1. However, the present invention is not limited to such embodiments. For example, $2^4$ times is applicable.

Figure 7:
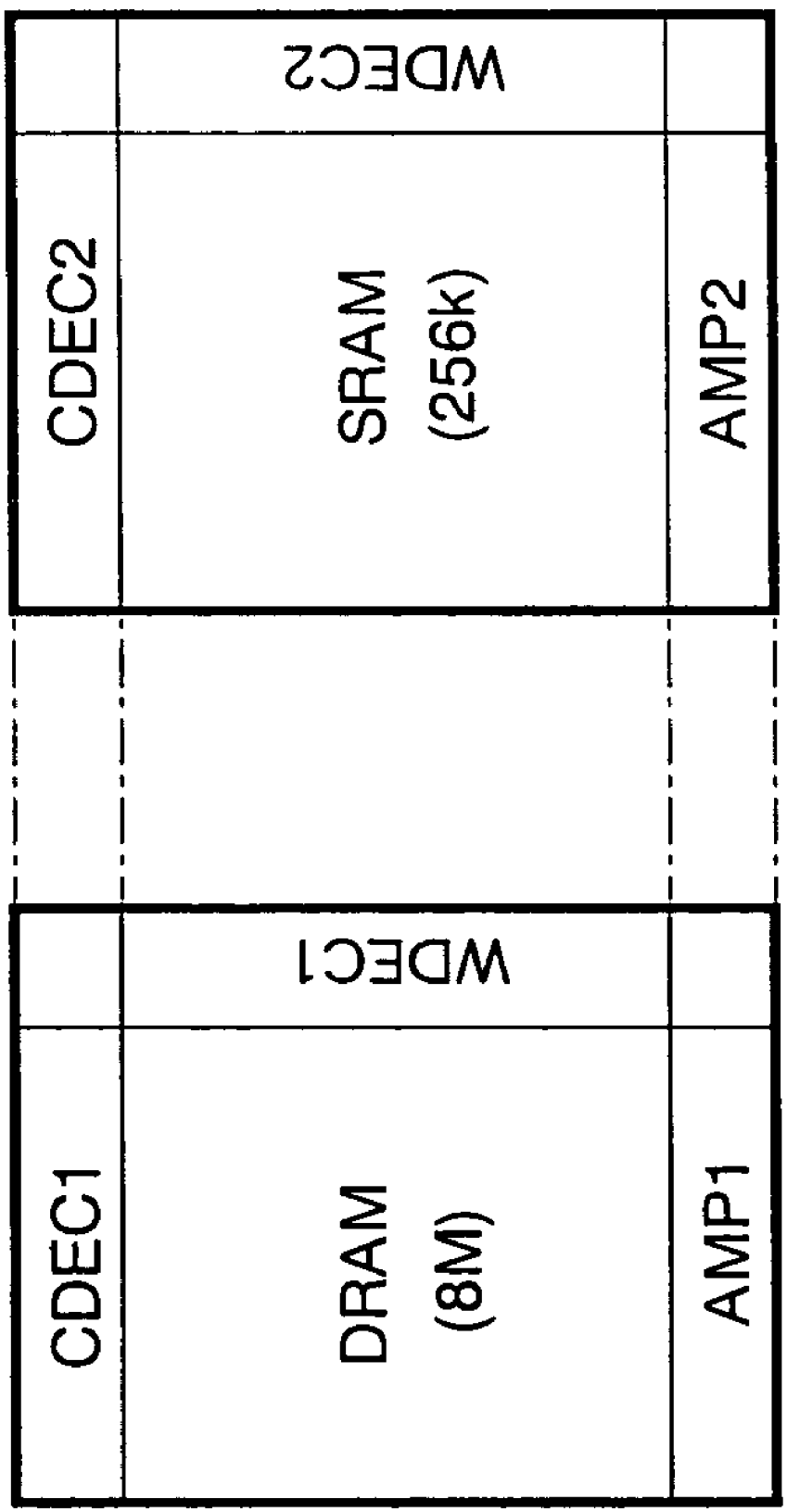
FIG. 7 is an explanatory diagram showing an example of a minimum layout unit of a DRAM block and an SRAM block.

FIG. 7 shows an example of the minimum layout unit of a DRAM block and an SRAM block. When the areal ratio between the first and second memory cells MC1 and MC2 is set at $2^a$ (a is a positive integer), it is easily possible to form the DRAM block and the SRAM block in the same size as shown in the diagram. Consequently, the column decoder rows CDEC1, CDEC2, the word decoder rows WDEC1, WDEC2, and the amplifier rows AMP1, AMP2 can be arranged at the same positions relative to the DRAM block and SRAM block. As a result, block units including the peripheral circuits shown in the diagram can be combined freely to constitute a system memory having a predetermined memory capacity easily.

Up to this point, the present invention has been described in detail. The foregoing embodiments and modifications thereof are no more than mere examples of the invention, however, and the present invention is by no means limited thereto. It is obvious that modifications may be made without departing from the scope of the present invention.

The invention is not limited to the above embodiments and various modifications may be made without departing from the spirit and scope of the invention. Any improvement may be made in part or all of the components.

What is claimed is:
1. A semiconductor integrated circuit comprising:
a first memory block, further comprising:
first memory cells;
first bit lines connected to the first memory cells; and
first word lines connected to the first memory cells; and
a second memory block, further comprising:
second memory cells, a type of which are different from that of the first memory cells and operating independently of the first memory block;
second bit lines connected to the second memory cells; and
second word lines connected to the second memory cells, wherein
said second memory cells each have an area $2^a$ times an area of each of said first memory cells, wherein a is a positive integer; and further wherein
said first and second bit lines are wired in a same direction;
said first and second word lines are wired in a same direction;

said first memory cells are memory cells of a dynamic RAM;
said second memory cells are memory cells of a static RAM;
said first memory block includes a sense amplifier row which amplifies data signals on said first bit lines; and
said second memory block includes a redundancy memory cell row land a connection area which connects a well region with a power supply line, the well region being formed on a semiconductor substrate.

2. A semiconductor integrated circuit comprising:
a first memory block further comprising:
  first memory cells;
  first bit lines connected to the first memory cells; and
  first word lines connected to the first memory cells;
a second memory block further comprising:
  second memory cells of a type different from that of the first memory cells and operating independently of the first memory block;
  second bit lines connected to the second memory cells; and
  second word lines connected to the second memory cells;
a first amplifier row being formed on one end of said first memory block, inputting/outputting data signals from/to said first bit lines; and
a second amplifier row being formed on one end of said second memory block,
inputting/outputting data signals from/to said second bit lines, wherein
  said second memory cells each have an area $2^a$ times an area of each of said first memory cells, wherein a is a positive integer;
  said first and second bit lines are wired in a same direction;
  said first and second word lines are wired in a same direction; and
  said first and second amplifier rows are arranged in a row in the same direction.

3. The semiconductor integrated circuit according to claim 2, comprising:
  a common data bus line through which a data signal is inputted/outputted to/from said first and second bit lines, wherein
  said common data bus line is wired over said first and second amplifier rows in the direction in which said first and second amplifier rows are arranged.

4. A semiconductor integrated circuit comprising:
a first memory block further comprising:
  first memory cells;
  first bit lines connected to the first memory cells; and
  first word lines connected to the first memory cells;
a second memory block further comprising:
  second memory cells of a type different from that of the first memory cells and operating independently of the first memory block;
  second bit lines connected to the second memory cells; and
  second word lines connected to the second memory cells;
a first column decoder row being formed on one end of said first memory block,
selecting any one of said first bit lines according to a column address signal; and a second column decoder row being formed on one end of said second memory block, selecting any one of said second bit lines according to said column address signal, wherein:
  said second memory cells each have an area $2^a$ times an area of each of said first memory cells, wherein a is a positive integer;
  said first and second bit lines are wired in a same direction;
  said first and second word lines are wired in a same direction; and
  said first and second column decoder rows are arranged in a row in the same direction.

5. The semiconductor integrated circuit according to claim 4, comprising
  a common column address signal line through which said column address signal is transmitted to said first and second column decoder rows, wherein
  said common column address signal line is wired over said first and second column decoder rows in the direction in which said first and second column decoder rows are arranged.

6. A semiconductor integrated circuit comprising:
a first memory block further comprising:
  first memory cells;
  first bit lines connected to the first memory cells; and
  first word lines connected to the first memory cells;
a second memory block further comprising;
  second memory cells of a type different from that of said first memory cells and operating independently of said first memory block;
  second bit lines connected to the second memory cells; and
  second word lines connected to the second memory cells;
a first word decoder row being formed on one end of said first memory block,
selecting any one of said first word lines according to a row address signal;
a second word decoder row being formed on one end of said second memory block, selecting any one of said second word lines according to said row address signal; and
a common row address signal line through which said row address signal is transmitted to said first and second word decoder rows, wherein:
  said second memory cells each have an area $2^a$ times an area of each of said first memory cells, wherein a is a positive integer;
  said first and second bit lines are wired in a same direction;
  said first and second word lines are wired in a same direction;
  said first and second word decoder rows are arranged in a row in the same direction; and
  said common row address signal line is wired over said first and second word decoder rows in the direction in which said first and second word decoder rows are arranged.

* * * * *